(12) United States Patent
Xu et al.

(10) Patent No.: US 7,283,214 B2
(45) Date of Patent: Oct. 16, 2007

(54) SELF-MIXING LASER RANGE SENSOR

(75) Inventors: Jun Xu, Hefei (CN); Tianpeng Zhao, Hefei (CN); Hai Ming, Hefei (CN); Jianping Xie, Hefei (CN); Deyong He, Hefei (CN); Liang Lv, Hefei (CN); Huaqiao Gui, Hefei (CN); Bo Yi, Hefei (CN); Lei Guo, Hefei (CN); Craig S. Ranta, Redmond, WA (US); Yuan Kong, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 11 days.

(21) Appl. No.: 11/249,682

(22) Filed: Oct. 14, 2005

(65) Prior Publication Data

US 2007/0091295 A1 Apr. 26, 2007

(51) Int. Cl.
*G01C 3/08* (2006.01)
(52) U.S. Cl. ............... 356/5.15; 356/5.01; 356/5.1
(58) Field of Classification Search ............... 356/5.15
See application file for complete search history.

(56) References Cited

U.S. PATENT DOCUMENTS

| | | | |
|---|---|---|---|
| 3,954,335 A | 5/1976 | Bodlaj | |
| 4,240,745 A | 12/1980 | Green | |
| 4,379,968 A | 4/1983 | Ely et al. | |
| 4,721,385 A | 1/1988 | Jelalian et al. | |
| 5,114,226 A * | 5/1992 | Goodwin et al. | 356/4.09 |
| 5,125,736 A * | 6/1992 | Vaninetti et al. | 356/5.1 |
| 5,274,361 A | 12/1993 | Snow | |
| 5,274,363 A | 12/1993 | Koved et al. | |
| 5,475,401 A | 12/1995 | Verrier et al. | |
| 5,510,604 A | 4/1996 | England | |
| 5,781,297 A | 7/1998 | Castore | |
| 6,015,089 A | 1/2000 | Hecht et al. | |
| 6,040,914 A | 3/2000 | Bortz et al. | |
| 6,333,735 B1 | 12/2001 | Anvekar | |
| 6,525,677 B1 | 2/2003 | Printzis | |

(Continued)

FOREIGN PATENT DOCUMENTS

WO WO2005/055037 6/2005

OTHER PUBLICATIONS

Logitech® G7 Laser Cordless Mouse; <http://www.logitech.com/index.cfm/products/details/US/EN,CRID=2135,CONTENTID=10716>; date of first publication unknown, but on or before Oct. 24, 2005; 3 pages.

(Continued)

*Primary Examiner*—Thomas H. Tarcza
*Assistant Examiner*—Luke D. Ratcliffe
(74) *Attorney, Agent, or Firm*—Banner & Witcoff, Ltd.

(57) ABSTRACT

A laser range finder includes a laser and a photosensitive element. The laser projects a beam onto a target surface. A backscattered portion of the laser beam returns to the laser from the target surface and enters the laser emitting cavity. Variations in laser output power are detected by the photosensitive element, which provides a "beat" signal to a frequency detection circuit. The frequency detection circuit includes a difference frequency analog phase locked loop (DFAPLL) providing a purified form of the beat signal. The frequency of the purified beat signal is determined and used to calculate distance to the target surface.

11 Claims, 6 Drawing Sheets

U.S. PATENT DOCUMENTS

| | | |
|---|---|---|
| 6,646,723 B1 | 11/2003 | Dubovitsky et al. |
| 6,687,274 B2 | 2/2004 | Kahen |
| 6,872,931 B2 | 3/2005 | Liess et al. |
| 6,903,662 B2 | 6/2005 | Rix et al. |
| 2002/0117549 A1 | 8/2002 | Lee |
| 2002/0158838 A1 | 10/2002 | Smith et al. |
| 2003/0006367 A1 | 1/2003 | Liess et al. |
| 2003/0085284 A1 | 5/2003 | Bremer et al. |
| 2003/0085878 A1 | 5/2003 | Luo |
| 2003/0128188 A1 | 7/2003 | Wilbrink et al. |
| 2003/0128190 A1 | 7/2003 | Wilbrink et al. |
| 2004/0004128 A1 | 1/2004 | Pettinelli et al. |
| 2004/0075823 A1* | 4/2004 | Lewis et al. ............... 356/5.01 |
| 2004/0095323 A1 | 5/2004 | Ahn |
| 2004/0213311 A1 | 10/2004 | Johnson et al. |
| 2004/0227954 A1 | 11/2004 | Xie |
| 2004/0228377 A1 | 11/2004 | Deng et al. |
| 2004/0246460 A1* | 12/2004 | Auracher et al. .......... 356/4.01 |
| 2005/0068300 A1 | 3/2005 | Wang et al. |
| 2005/0156875 A1 | 7/2005 | Kong |
| 2005/0157202 A1 | 7/2005 | Lin et al. |
| 2005/0179658 A1 | 8/2005 | Huang et al. |
| 2005/0231484 A1 | 10/2005 | Gordon et al. |

OTHER PUBLICATIONS

Logitech® MX™ 1000 Laser Cordless Mouse; <http://www.logitech.com/index.cfm/products/details/US/EN,CRID=3,CONTENTID=9043,a d=g03&srch=1>; date of first publication unknown, but on or before Oct. 24, 2005; 3 pages.

5-button USB Laser Mouse; <http://www.logear.com/main.php?loc=product&item=GME521>; date of first publication unknown, but on or before Oct. 24, 2005; 3 pages.

Houghton, Andrew, et al., "A Method for Processing Laser Speckle Images to Extract High-Resolution Motion" pp. 611-617, Meas. Sci. Technol. 8 (1997), published Feb. 24, 1997.

Yamaguchi, Ichirou, et al., "Stabilized and Accelerated Speckle Strain Gauge", SPIE Conference on Laser Interferometry; Quantitative Analysis of Interferograms: Third in a Series, Aug. 1989; published Sep. 22, 1991; 8 pages.

Taka, Nobukatsu, et al., Displacement Measurement of Speckles Using a 2-D Level-cross Technique, Applied Optics, vol. 22, No. 22, published Nov. 15, 1983; pp. 3514-3519.

D. Dupuy, et al., "Improvement of the FMCW Laser Range-Finder by an APD Working as an Optoelectronic Mixer," IEEE Transactions on Instrumentation and Measurement, 51, 5, pp. 1010-1014, 2002.

R.P. Griffiths, et al., "Cavity-resonant Optical Position Sensor-A New Type of Optical Position Sensor," p. 328, CLEO, 1998.

Hewett, Jacqueline, "Holey VCSELs Produce High Powers", <http://www.optics.org/articles/news/10/12/5/1>, date of first publication unknown, but dated Dec. 2004; 2 pages.

"Ultra-miniature Laser Displacement Sensors", <http://www.globalspec.com/FeaturedProducts/Detail/BaumerElectric/Ultraminiature_Laser_Displacement_Sensors/13470/1>, first date of publication unknown, but prior to Sep. 12, 2005, 2 pages.

Nerin, P., et al., "Absolute Distance and Velocity Measurement by the FMCW Technique and Self-Mixing Interference Effect Inside a Single-Mode Nd:YAG-LiTAO$_3$ Microchip Laser", Journal of Optics, vol. 29, No. 3, Jun. 1998.

Lowery, James, et al., "Design and Stimulation of a Simple Laser Rangefinder Using a Semiconductor Optical Amplifier-Detector", Optics Express, vol. 13, No. 10, May 16, 2005; pp. 3647-3652.

Maler, T., et al., "A Compact Sensor for Interferometric Displacement Measurements", <http://www.fke.tuwien.ac.at/Publications/jb/fdjb99/tm.htm>, first date of publication unknown, but dated 1999, 2 pages.

"Laser Sensors Offer Long Stand-off and Measurement Range", ThomasNet Industrial news Room, <http://www.news.thomasnet.com/fullstory/458005/1782>, date of first publication unknown, but dated Dec. 3, 2004, 5 pages.

T. Bosch, et al., "The Self-Mixing Interference Inside a Laser Diode: Application to Displacement, Velocity and Distance Measurement", Proc. SPIE, vol. 3478, pp. 98-108, Jul. 1998.

Shigenobu Shinohara, et al., "Compact and High-Precision Range Finder with Wide Dynamic Range and its Application", IEEE Transactions on Instrumentation and Measurement, vol. 41, No. 1, pp. 40-44, Feb. 1992.

Roland E. Best, "Phase-Locked Loops, Theory, Design, and Applications", McGraw-Hill Book Company, pp. 151-164, 1984 (15 pages).

H. Yeh, et al., "Localized Fluid Flow Measurements with an He-Ne Laser Spectrometer", Appl. Phys. Lett., vol. 4, No. 10, pp. 176-178, May 15, 1984.

S.W. James, et al., "Fiber Optic Based Reference Beam Laser Doppler Velocimetry", Optics Communications, 119, pp. 460-464, Sep. 15, 1995.

M.J. Rudd, "A New Theoretical Model for the Laser Dopplemeter", J. Phys. E2, pp. 56-58, 1969.

M.J. Rudd, "A Laser Doppler Velocimeter Employing the Laser as a Mixer-Oscillator", J. Phys. E1, Series 2, vol. 1, pp. 723-726, Feb. 21, 1968.

T. Ito, et al., "Integrated Microlaser Doppler Velocimeter", J. Lightwave Tech., vol. 17, No. 1, pp. 30-34, Jan. 1999.

E.T. Shimizu, "Directional Discrimination in the Self-Mixing Type Laser Doppler Velocimeter", Appl. Opt., vol. 25, No. 21, pp. 4541-4544, Nov. 1987.

S.K. Ozdemir, et al., "New Speckle Velocimeter Using Two Self-Mixing Laser Diodes", SICE 115C-3, pp. 947-950, Jul. 29-31, 1997.

S.L. Toh, et al., "Whole Field Surface Roughness Measurement by Laser Spackle Correlation Technique", Optics and Laser Technology, 33, pp. 427-434, Jun. 5, 2001.

M. Nagahara, et al., "Real-Time Blood Velocity Measurement in Human Retinal Vein Using the Laser Speckle Phenomenon", Japanese Journal of Ophthalmology, 43, pp. 186-195, 1999.

T. Shibata, et al., "Laser Speckly Velocimeter Using Self-Mixing Laser Diode", IEEE Transactions on Instrumentation and Measurement, vol. 45, No. 2, pp. 499-503, Apr. 2, 1998.

S. Kato, et al., "Optical Fibre Laser Doppler Velocimetry Based on Laser Diode Frequency Modulation", Optical and Laser Technology, vol. 27, No. 4, pp. xii, 1995.

W.H. Stevenson, "Optical Frequency Shifting by means of a Rotating diffraction Grating", Appl. Opt. 9, vol. 9, No. 3, pp. 649-652, Mar. 1970.

M.K. Mazumber, et al., "Laser Doppler Velocity Measurement Without Directional Ambiguity By Using Frequency Shifted Incident Beams", Appl. Phys. Lett., vol. 16, No. 1, pp. 462-464, Jun. 1, 1970.

S. Shinohara, et al., "Laser Doppler Velocimeter Using the Self-Mixing Effect of a Semiconductor Laser Diode", Appl. Opl., vol. 25, No. 9, pp. 1417-1419, 1988.

H.W. Jentink, et al., "Small Laser Doppler Velocimeter Based on the Self-Mixing Effect in a Diode Laser", Appl. Opt. vol. 27, No. 2, pp. 379-385, Jan. 15, 1998.

S. Shinohara, et al., "Acquisition of 3-D Image of Still or Moving Objects Utilizing Laser Diode Range-Finding Speedometer", IEEE, pp. 1730-1735, 1993.

L. Fabiny, et al., "Interferometric Fiber-Optic Doppler Velocimeter with High-Dynamic Range", IEEE Photonics Toch. Lett., vol. 9, No. 1, pp. 79-81, Jan. 1997.

S. Shinohara, et al., "Detection of Mesa Spots and Indents on Slowly Moving Object Surface by Laser-Light Beam Scanning", SICE, 105C-5, pp. 1167-1170, Jul. 26-28, 1995.

Y. Kakiuchi, et al., "Measurement of Small Vibrational Displacement by SM LD Vibrometer with Resonance Element", SICE, 107 A-4, pp. 903-908, Jul. 29-31, 1998.

N. Tsukuda, et al., "New Range-Finding Speedometer Using a Self-Mixing Laser Diode Modulated by Triangular Wave Pulse Current", IEEE, WEAM 4-1, pp. 332-335, May 1994.

Roy Lang, et al., "External Optical Feedback Effects on Semiconductor Injection Laser Properties", IEEE Journal of Quantum Electronics, vol. QE-16, No. 3, pp. 347-355, Mar. 3, 1980.

Acket, G., et al., "The Influence of Feedback Intensity on Longitudinal Mode Properties and Optical Noise in Index-Guided Semiconductor Lasers", IEEE Journal of Quantum Electronics, vol. QE-20, No. 10, pp. 1163-1169, Oct. 1984.

P.J. de Groot, et al., "Ranging and Velocimetry Signal Generation in a Backscatter-Modulated Laser Diode", Appl. Opt., vol. 27, No. 21, pp. 4475-4480, Nov. 1988.

P.A. Porta, "Laser Doppler Velocimetry by Optical Self-Mixing in Vertical-Cavity Surface-Emitting Lasers", IEEE Photonics Technology Letters, vol. 14, No. 12, pp. 1719-1721, Dec. 2002.

S.K. Ozdemir, et al., "Effect of Linewidth Enhancement Factor on Doppler Beat Waveform Obtained From a Self-Mixing Laser Diode", Optical Review, vol. 7, No. 6, pp. 550-554, Jun. 22, 2000.

S. Shinohara, et al., "Compact and Versatile Self-Mixing Type Semiconductor Laser Doppler Velocimeters with Direction-Discrimination Circuit", IEEE Transactions on Instrumentation and Measurement, vol. 38, No. 2, pp. 574-577, Apr. 1989.

James H. Churnside, "Laser Doppler Velocimetry by Modulating a $CO_2$ Laser with Backscattered Light", Appl. Opt., vol. 23, No. 1, pp. 61-66, Jan. 1984.

M.H. Koelink, et al., "Laser Doppler Velocimeter Based on the Self-Mixing Effect in a Fiber-Coupled Semiconductor Laser: Theory", Appl. Opt., vol. 31, No. 18, pp. 3401-3408, Jun. 20, 1992.

W.M. Wang, et al., "Self-Mixing Interference in a Diode Laser: Experimental Observations and Theoretical Analysis", Appl. Opt. vol. 32, No. 9, pp. 1551-1558, Mar. 20, 1993.

Guido Giuliani, et al., "Laser Diode Self-Mixing Technique for Sensing Applications", J. Opt. A: Pure Appl. Opt, 4, vol. 4, No. 6, pp. S283-S294, Nov. 4, 2002.

Richard C. Addy, et al., "Effects of External Reflector Alignment in Sensing Applications of Optical Feedback in Laser Diodes", IEEE Journal of Lightwave Technology, December, vol. 14, No. 12, pp. 2672-2676, Dec. 1996.

S.F. Yu, "Theoretical Analysis of Polarization Bistability in Vertical Cavity Surface Emitting Semiconductor Lasers", IEEE Journal of Lightwave Technology, vol. 15, No. 6, pp. 1032-1041, Jun. 1997.

F. Robert, et al., "Polarization Modulation Dynamics of Vertical-Cavity Surface-Emitting Lasers with an Extended Cavity", IEEE Journal of Quantum Electronics, vol. 33, No. 12, 2231-2239, Dec. 1997.

J. Danckaert, et al., "Minimal Rate Equations Describing Polarization Switching in Vertical-Cavity Surface-Emitting Lasers", Optics Communications, vol. 201, pp. 129-137, Jan. 2002.

J. Martin-Regalado, et al., "Polarization Properties of Vertical-Cavity Surface-Emitting Lasers", IEEE Journal of Quantum Electronics, vol. 33, No. 5, pp. 765-783, May 1997.

S. Donati, et al., "Laser Diode Feedback Interferometer for Measurement of Displacements Without Ambiguity", IEEE Journal of Quantum Electronics, vol. 31, No. 1, pp. 113-119, Jan. 1995.

K. Petermann, et al., "External Optical Feedback Phenomena in Semiconductor Lasers", IEEE Journal of Selected Topics in Quantum Electronics, vol. 1, No. 2, pp. 480-489, Jun. 1995.

"Optical Mouse Saves Space", <http://www.optics.org/articles/news/8/6/23/1>, date of first publication unknown, but believed to be Jun. 26, 2002.

Wu, Qingguang, et al., "New Vibrometer Using Self-Mixing Laser Diode Modulated with Triangular Current", Shizuoka University, Cleo/Pacific Rim/, pp. 290-291 (1997).

Besnard, Pascal, et al., "Microwave Spectra in External-Cavity Semiconductor Lasers: Theoretical Modeling of Multipass Resonances", IEEE Journal of Quantum Electronics, pp. 1713-1722, (Aug. 1994) vol. 30, No. 8.

Besnard, Pascal, et al., "Feedback Phenomena in a Semiconductor Laser Induced by Distant Reflectors", IEEE Journal of Quantum Electronics, pp. 1271-1284, (May 1993) vol. 29, No. 5.

Short Talk: Fitt's Law & Text Input, New Horizons, "Interface with Pre-Typing Visual Feedback for Touch Sensitive Keyboard", pp. 750-751, CHI 2003.

Bezin, G., et al., "A New Laser Range-Finder Based on FMCW-Like Method", IEEE Instrumentation and Measurement Technology Conference, (1996), pp. 90-93.

Peng, Gang, et al., "Design of 3-D Mouse Using Ultrasonic Distance Measurement", International Conference on Sensors and Control Techniques, pp. 226-229; (2000), Proceedings of SPEI, vol. 4077.

Shinohara, Shigenobu, et al., "High-Resolution Range Finder with Wide Dynamic Range of 0.2m to 1m using a Frequency-Modulated Laser Diode", pp. 646-651, (1989), IEEE.

Bosch, Thierry, et al., "Three-Dimensional Object Construction Using a Self-Mixing Type Scanning Laser Range Finder", pp. 1326-1329. (1998), IEEE Transactions on Instrumentation and Measurement, vol. 47, No. 5.

Dorsch, Rainer G., et al., "Laser Triangulation: Fundamental Uncertainty in Distance Measurement", pp. 1306-1314, (1994), Applied Optics, vol. 33, No. 7.

Dupuy, D., et al., "A FMCW Laser Range-Finder Based on a Delay Line Technique", pp. 1084-1088, (2001), IEEE Instrumentation and Measurement Technology Conference.

Journal, B., et al., "High Resolution Laser Range-Finder Based on Phase-Shift Measurement Method", pp. 123-132, (1998), SPIE vol. 3520.

Favre-Bulle, Bernard, et al., "Efficient Tracking of 3D-Robot Positions by Dynamic Triangulation", pp. 446-449 (1998), IEEE ITMC Session on Instrumentation and Measurement in Robotics.

Bosch, T. et al., "A Low-cost, Optical Feedback Laser Range-Finder with Chirp Control", (2001), IEEE Instrumentation and Measurement Technology Conference.

Tucker, John, "Laser Range Finder Using the Self-Mixing Effect in a Vertical Cavity Surface Emitting Laser" (VCSEL), pp. 1-71, (2001).

De Groot, Peter, et al., "Chirped Synthetic-Wavelength Interferometry", pp. 1626-1628, (1992), Optics Letters, vol. 17, No. 22.

Gelmini, E, et al., "Tunable Double-Wavelength Heterodyne Detection Interferometer for Absolvute-Distance Measurements", pp. 213-215, (1994), Optics Letters, vol. 19, No. 3.

IBM Technical Disclosure Bulletin, "Ultrasonic Cursor Position Detection", pp. 6712-6714, (1985), vol. 27, No. 11.

Tucker, J.R., et al., "Laser Range Finding Using the Self-Mixing Effect in a Vertical-Cavity Surface Emitting Laser", pp. 583-586, (2002), Conference on Optoelectronic and Microelectronic Materials and Devices.

Journal, B, et al., "A Low-Cost Laser Range Finder Based on an FMCW-Like Method", pp. 840-843 (2000), IEEE Transactions on Instrumentation and Measurement, vol. 49, No. 4.

Marques, Lino, et al., "3D Laser-Based Sensor for Robotics", pp. 1328-1331, (1994) ISR-Institute of Systems and Robotics.

Marques, Lino, et al., "A New 3D Optical Triangulation Sensor for Robotics", pp. 512-517, (1998), IEEE International Workshop on Advanced Motion Control.

Preucil, Libor, "Building a 2D Environmental Map From Laser Range-Finder date", pp. 290-295, (2000), IEEE Intelligent Vehicle Symposium.

Nyland, Lars S., et al., "Capturing, Processing and Rendering Real-World Scenes", IEEE 2001.

Onodera, Ribun, et al., "Effect of Laser-Diode Power Change on Optical heterodyne Interferometry", pp. 675-681, (1995), Journal of Lightwave Technology, vol. 13, No. 4.

Besesty, Pascal, et al., "Compact FMCW Advanced Laser Range Finder", pp. 552-553, (1999) Technical Digest Conference on Lasers and Electro-Optics.

Poujouty, Stephane, et al., Digital Laser Ranger Finder: Phase-Shift Estimation by Undersampling Technique, pp. 1312-1317, (1999), IEEE.

Zheng, Jiang A., "A Flexible Laser Range Sensor Based on Spatial-Temporal Analysis", (2000), Proceedings of the International Conference on Pattern Recognition.

Dandliker, R., et al., "Two-Wavelength Laser Interferometry Using Superheterodyne Detection", pp. 339-341, Optics Letters, (1998) vol. 13, No. 5.

Zou, Q., et al. "Silicon Capacitive Microphones with Corrugated Diaphragms", School of Mechanical and Production Engineering, Nanyang Technological University; date of first publication unknown, but believed to be prior to Sep. 30, 2003.

Rornbach, Pirmin, et al., "A Low-Voltage Silicon Condenser Microphone for Hearing Instrument Applications, Microtronic A/S"; date of first publication unknown, but believed to be prior to Sep. 30, 2003.

Shinoda, Yukitaka, et al., "Real-Time Computation of Distance and Displacement by Software Instruments Using Optical Frequency Modulation", pp. 82-83, (2002), SICE.

Cole, Timothy, et al., "Fight Characterization of the Near Laser Rangefinder", pp. 131-142, (2000), Laser Radar Technology and Applications, Proceedings of SPIE vol. 4035.

Viarani, Luigi, et al., "A CMOS Smart Pixel for Active 3-D Vision Applications", pp. 145-152, (2004), IEEE Sensors Journal, vol. 4, No. 1.

Wakitana, Jun, et al., "Wrist-Mounted Laser Rangefinder", pp. 362-367, (1995) Proceedings of the International Conference on Intelligent Robots and Systems.

Zahid, M., et al., "High-Frequency Phase Measurement for Optical Rangefinding System", pp. 141-148, (1997), IEEE Proceedings Science and Measurement Technology, vol. 144, No. 3.

Whetstone, Albert, "Free-Hand Data Input", pp. 11-28, Science Accessories Corporation (1970).

Acroname Articles, Demystifying the Sharp IR Rangers, <http://www.acroname.com/rootics/info/articles/sharp/sharp.html> (First published before Sep. 14, 2004).

Gagnon, Eric, "Laser Range Imaging Using the Self-Mxing Effect in a Laser Diode", pp. 693-699, (1999), IEEE Transactions on Instrumentation and Measurement, vol. 48, No. 3.

Canesta, Inc., "Data Input Alternatives for Mobile Devices", pp. 1-5, Nov. 28, 2002.

Steinmetz, Robert, et al., "Solving the Data Input Problem in Mobile Devices", pp. 1-6, Sep. 2002.

Tomasi, Carlo, et al., "Full Size Projection Keyboard for Handheld Devices", pp. 70-75, (2003) Communications of the ACM, vol. 46, No. 7.

Hebert, Martial, "Active and Passive Range Sensing for Robotics", pp. 102-110, (2000) IEEE International Conference for Robotics and Automation.

"Laser-Based Tracking for Real-Time 3D Gesture Acquistion", <http://www.k2.t.u-tokyo.ac.jp/fusion/LaserActive Tracking/index-e.html>; first published on or before Aug. 3, 2004.

Aeroflex Mixed-Signal Asics, "Choosing an Ultrasonic Sensor for Proximity or Distance Measurement", Part 1: Acoustic Considerations <http://www.sensorsmag.com/articles/0299/acou0299/main.shtml>; first published in 1999.

Aeroflex Mixed-Signal Asics, "Choosing an Ultrasonic Sensor Proximity or Distance Measurement", Part 2: Optimizing Sensor Selection <http://www.sensormag.com/articles/0399/0399_28/main.stml>; first published in 1999.

Canesta Keyboard <http://www.canesta.com/cansetakeyboard.htm>: first published on or after Aug. 3, 2004.

Canesta Keyboard, <http://www.canesta.com/faq.htm>; first published on or after Aug. 3, 2004.

Sahin Kaya Ozdemir, et al., "Velocity Measurement by a Self-Mixing Laser Diode Using Speckle Correlation", IEEE, 1999, pp. 1756-1760.

Wang, W.M., et al., "Self-Mixing Interference Inside a Single-Mode Diode Laser for Optical Sensing Applications," pp. 1577-1587, Journal of Lightwave Technology, vol. 12, No. 9 (1994).

Shaked, Doron, et al., "Graphical Indicia", 2.2 Barcode-Reading Sub-System, <http://www.hpl.hp.com/research/isl/vsb/GraphIndicalCIP.pdf>, first date of publication unknown but, on or before Oct. 13, 2005, 4 pages.

Tsaur, Jiunnjye, et al., "2D Micro Scanner Actuated by Sol-gel Derived Double Layered PZT", National Institute of Advanced Industrial Science and Technology (AIST), <http://toshi.fujita3.iis.u-tokyo.ac.jp/Optical_MEMS_Archives/MEMS%202002/Book/135.PDF>, first date of publication unknown, but on or before 2002, pp. 548-551.

Sasaki, Minoru, et al., "Optical Scanner on a Three-Dimensional Microoptical Bench", Journal of Lighwave Technology, vol. 21, Issue 3, 602, Mar. 2003, <http://jlt.osa.org/abstract.cfm?id=72540>. 1 page.

Lless, Martin, et al., "A Miniaturized Miltidrectional Optical Motion Sensor and Input Device Based on Laser Self-Mixing", Meas. Sci. Technol. 13, 2001-2006; <http://www.iop.org/EJ/abstract/0957-0233/13/12/327>, Nov. 1, 2002; Issue 12; 2 pages.

Gokturk, S. Burek, et al., "A Time-Of-Flight Depth Sensor—System Description, Issues and Solutions," cvprw, p. 35, 2004 Conference on Computer Vision and Pattern Recognition Workshop (CVPRW'04), vol. 3, 2004, 9 pages.

"How Does 3DV's Technology Work?", <http://www.3dvsystems.com/technology/technology.html>, first date of publication unknown but on or before Oct. 13, 2005, 7 pages.

Goklurk, Salih Burak, et al., "3D Head Tracking Based on Recognition and interpolation Using a Time-of-Flight Depth Sensor," cvpr, pp. 211-217, 2004 IEEE Computer Society Conference on Computer Vision and Pattern Recognition (CVPR'04)—vol. 2, 2004, 7 pages.

U.S. Appl. No. 10/953,107, filed Sep. 30, 2004.

U.S. Appl. No. 11/154,828, filed Jun. 17, 2005.

U.S. Appl. No. 11/170,182, filed Jun. 30, 2005.

* cited by examiner

SELF-MIXING LASER RANGE SENSOR

BACKGROUND

In many applications, it is useful or necessary to measure a distance between two locations. Towards that end, there are numerous known techniques for measuring distance. In some cases, distance is measured mechanically. For example, a wheel, ball or other rolling member can be rolled across a surface. Indexed counters coupled to the rolling member can then be used to determine the distance traveled. Such mechanical measuring systems have a number of disadvantages, however. Notably, such systems typically require physical contact with an object to which (or over which) distance is being measured. In some cases, such contact is not practical. Even when physical contact may not be a problem, the mechanical components of such a system may be relatively expensive and/or the source of other problems (e.g., dirt accumulation).

Distance can also be measured by reflection of energy (electromagnetic or sound) from an object. Such techniques avoid many of the problems with mechanical measuring systems, and offer numerous other advantages. In many of these techniques, a laser is used. Laser range-finding systems can be very accurate. However, known laser range finding systems have their own set of limitations.

One class of laser range finders includes "time-of-flight" (TOF) systems. In TOF systems, light from a laser is reflected from a target and received in a receptor. By measuring the time needed for light to travel from the laser to the target and then back to the receptor, the distance between the laser and the target can be calculated. TOF systems are commonly used for measuring relatively long distances (tens of meters or more). At closer ranges, the travel time for the light is extremely short (tens of picoseconds), and accurate measurement can be quite difficult without the use of expensive detection circuitry.

Another type of TOF system uses the round trip delay time of the laser light to form part of a variable frequency oscillator circuit. The oscillation frequency is then correlated to the distance. Still another TOF system uses a modulated beam and calculates time of flight indirectly by comparing the output beam with the reflected beam. These techniques suffer from limited measurement range, and temperature drift or calibration issues.

Another group of laser range finders includes triangulation-based systems. In these types of systems, light from a laser is reflected from a target and received by a receptor positioned a known distance from the laser emitter. Based on that known distance and the angle of the reflected light, the distance to the target can be trigonometrically calculated. Triangulation-based systems are commonly used for shorter ranges. As the measurement distances increase, the variation in the angle of reflected light becomes quite small. Accurately detecting such small angles can require expensive optics and detection circuitry.

Yet another type of laser range finder utilizes the self-mixing effect. In particular, a portion of light reflected from a target returns to an emitting laser and enters the emitting cavity. The reflected light mixes with light being generated in the cavity and affects the power output of the laser. The power output variations relate to the distance traveled by the light to the target and back. By measuring changes in the laser power output, distance can be determined. Self-mixing-based systems offer significant advantages over other types of laser range finding. Because the emitting laser is also used as a receptor, fewer components are needed. Self-mixing-based systems can also be very accurate. However, self-mixing-based systems also present a number of challenges. The signal generated by self-mixing can be quite noisy, and accurate measurement of the self-mixing effects on laser power output can require relatively complex and expensive circuits. For at least these reasons, such systems have generally not been used in many applications.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In at least some embodiments, a laser range finder includes a laser and a photosensitive element. The laser is biased with a modulated bias current, and projects a beam onto a target surface in order to determine a distance between the laser and the target surface. A backscattered portion of the laser beam returns to the laser from the target surface and enters the laser emitting cavity. Because of the self-mixing effect, the output power of the laser beam varies in a periodic manner. The variations in output power are detected by the photosensitive element, which provides a "beat" signal to a frequency detection circuit. The frequency detection circuit includes a difference frequency analog phase locked loop (DFAPLL) having a voltage controlled oscillator (VCO) with a center frequency that is substantially greater than expected beat signal frequencies. The DFAPLL mixes the VCO output with a reference frequency to generate a difference frequency signal, with the difference frequency signal providing a purified form of the beat signal. The frequency of the purified beat signal is determined and used to calculate distance to the target surface.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
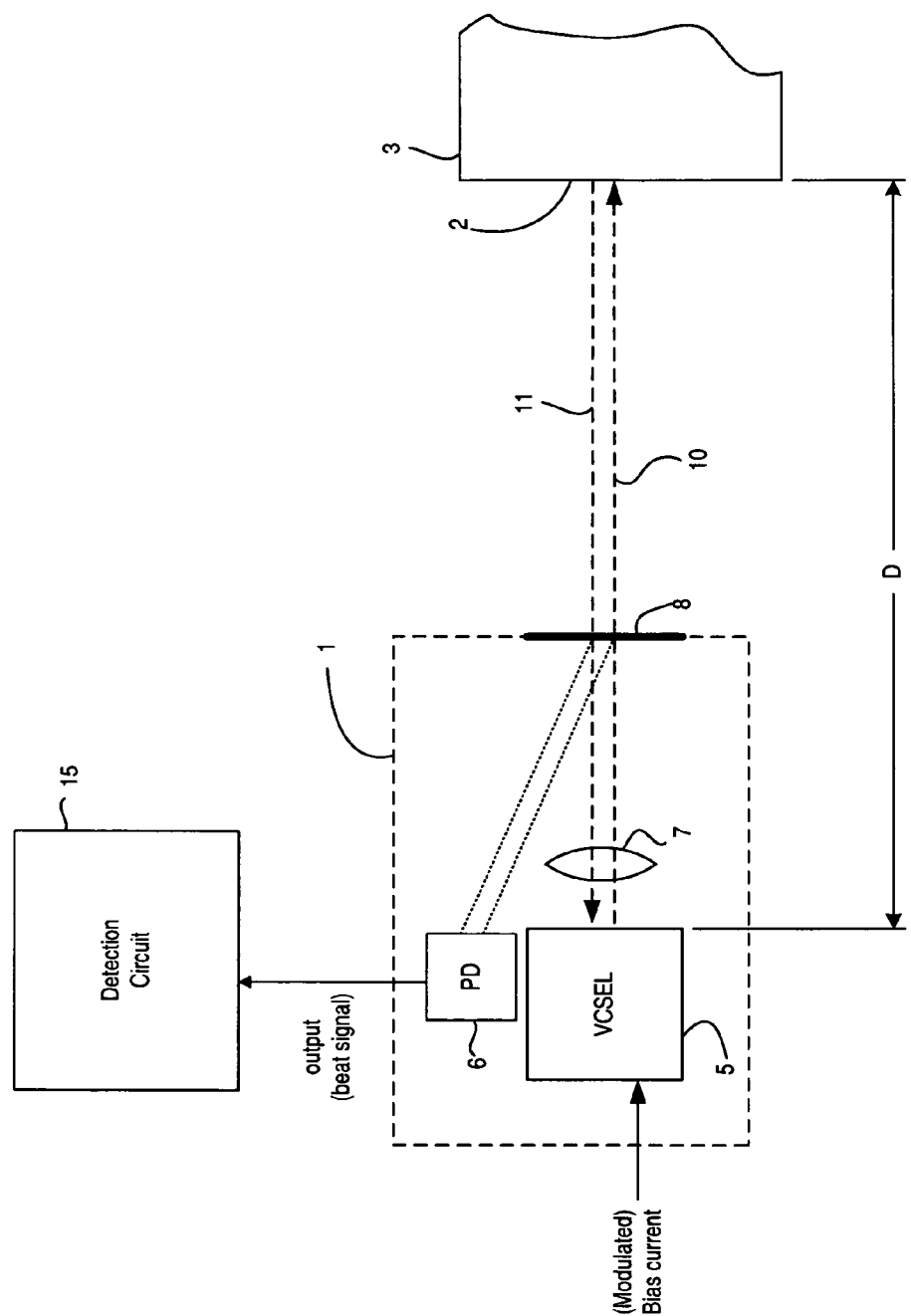
FIG. 1 is a block diagram of a range sensor according to at least some exemplary embodiments.

FIG. 1 is a block diagram of a ranger sensor 1 according to at least some exemplary embodiments of the invention. In FIG. 1, sensor 1 measures a distance D to a target surface 2 of an arbitrary target object 3. Sensor 1 includes a vertical cavity surface emitting laser (VCSEL) 5, a photosensitive detector (PD) 6, a lens 7 and a partially reflective surface 8. VCSEL 5 receives power in the form of a biasing current. Laser light emanating from the emitting cavity of VCSEL 5 passes through lens 7 and surface 8 to exit sensor 1 as outgoing light beam 10. A backscattered portion of beam 10

(shown as broken line arrow 11) is returned into the emitting cavity of VCSEL 5, as discussed more fully below. Surface 8 is partially reflective, and thus directs a small portion of the beam 10 (approximately 5%) to PD 6. The output of PD 6 varies based on the intensity of light reflected from surface 8. Accordingly, output of PD 6 can also be used to measure the output of beam 10. PD 6 can be a photodiode, a phototransistor or other type of device which varies its output based on the intensity of received light. Fluctuations in the output from PD 6 are measured by detection circuitry 15 and used to determine the distance D. Detection circuitry 15 is described in more detail below in conjunction with FIG. 4.

Backscattered light 11 from target surface 2 that enters the emitting cavity of VCSEL 5 mixes with the light being newly generated. Because of the self-mixing effect, the power output by VCSEL 5 in outgoing light beam 10 is thereby affected. Self-mixing per se is known in the art, and thus a detailed description of the phenomenon is not included herein. In general, however, the power of beam 10 will fluctuate (or "beat") in a periodic manner as a result of interference between the outgoing light being generated in the VCSEL emitting cavity and the backscattered light from a target. Although FIG. 1 shows outgoing light beam 10 and backscattered light 11 as separate arrows, this is only to simplify the drawing. In theory, backscattered light from a target mixes with the outgoing light beam to form a waveform that includes a beat.

The periodic fluctuation of the output beam power corresponds to mode hops in VCSEL 5 occurring at target displacements in multiples of λ/2, where λ is the wavelength of VCSEL 5. The wavelength of VCSEL 5 is periodically changed by modulating the bias current with a triangular wave function, so that phase shifts of 2π occur at every resonant mode created by the laser and the target. As is known in the art, the output wavelength of a VCSEL will increase as the bias current for that VCSEL increases. By modulating the bias current for VCSEL 5 with a triangular wave, the frequency of beam 10 will fall during the upslope of the modulating wave and will rise during the downslope of that modulating wave. The distance D can then be determined by finding the frequency spacing between the adjacent modes.

The distance D from VCSEL 5 to target surface 2 (i.e., the external cavity length for VCSEL 5) can be determined from Equation 1.

$$D = \frac{c}{2\Omega|m|p_{avg}} \quad \text{Equation 1}$$

In Equation 1, c is the speed of light (m/sec). The frequency modulation coefficient Ω, expressed in GHz/mA, provides the frequency of beam 10 for a given bias current over the operating range of VCSEL 5. The coefficient m is the slope of the triangular bias current modulating wave, expressed in mA/sec. The quantity $p_{avg}$ is the average period (e.g., time between peaks) of the beat signal. Because $p_{avg}$ is equal to the inverse of the average frequency ($f_{avg}$) of the beat signal, distance D can alternatively be determined from Equation 2.

$$D = \frac{f_{avg} * c}{2\Omega|m|} \quad \text{Equation 2}$$

Figure 2:
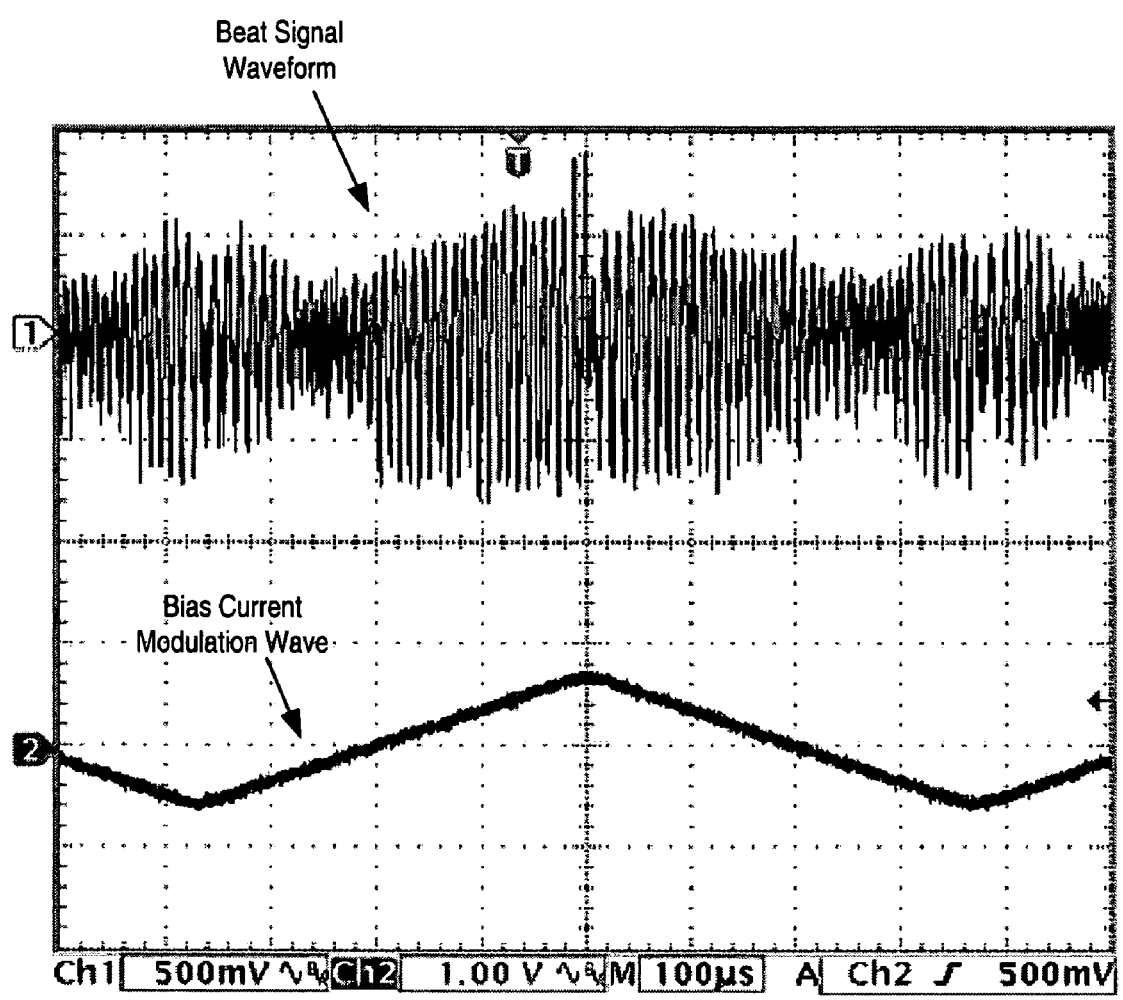
FIG. 2 is an example of a beat signal wave and a corresponding triangularly-modulated bias current.

FIG. 2 shows examples of a beat signal wave and a corresponding modulating wave for one type of single-mode VCSEL. In the example of FIG. 2, the output frequency of the VCSEL varies by +/−29 GHz; the modulating wave frequency ($f_m$) is 1.3 KHz, and the external cavity length (D) is 100 mm.

Figure 3A:
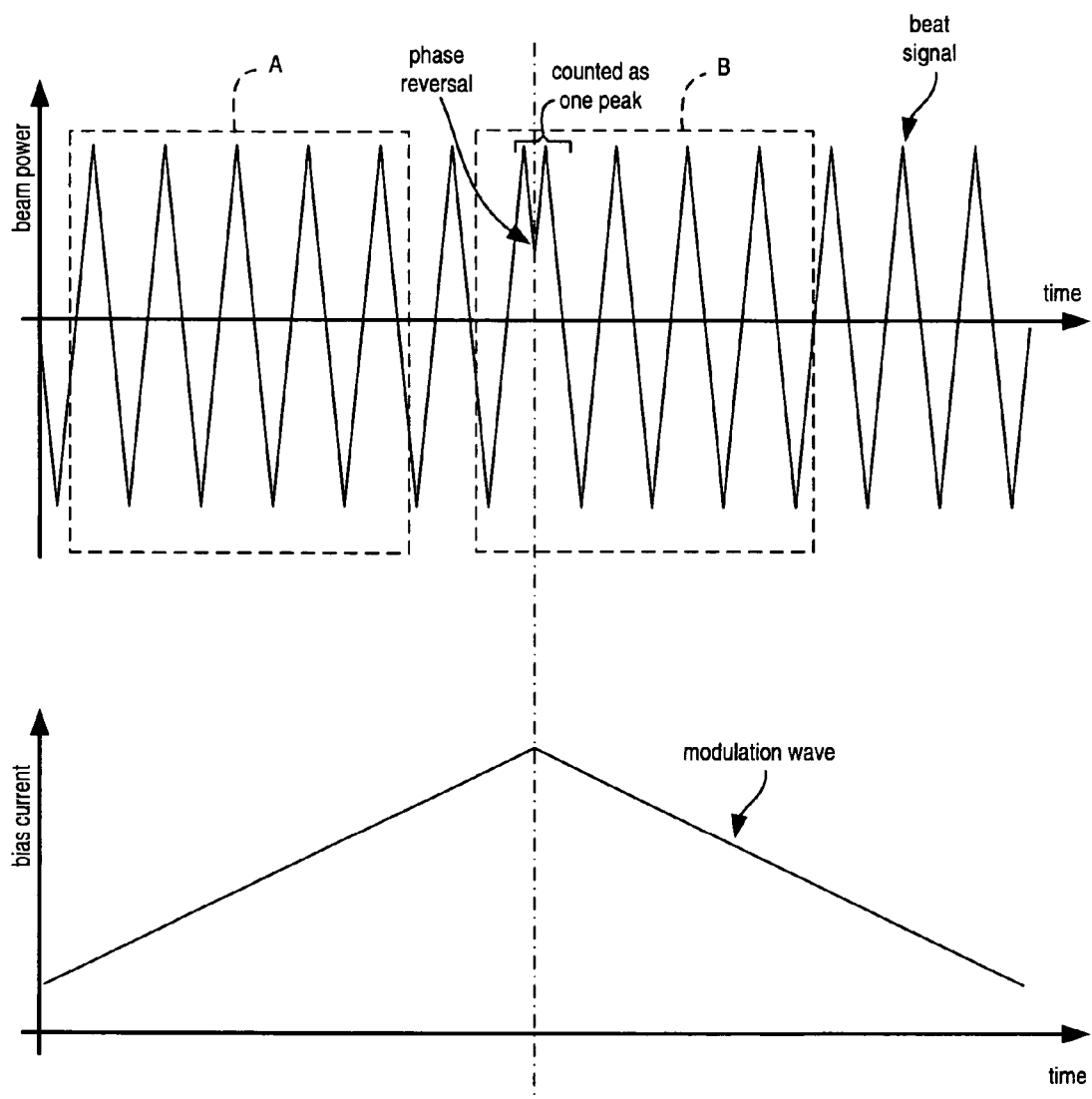
FIGS. 3A and 3B illustrate phase reversal accompanying inflection points in a triangular wave modulating a bias current.
Figure 3B:
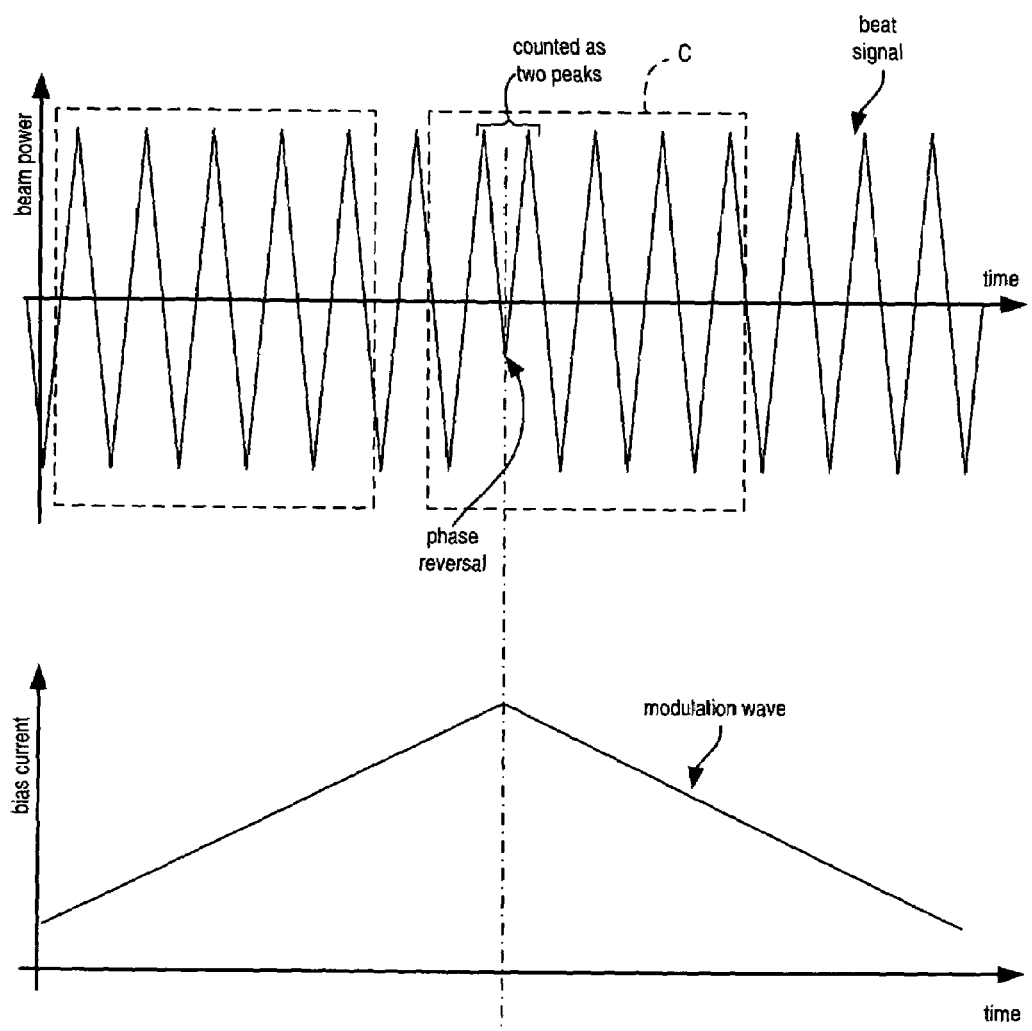

Although Equations 1 and 2 are relatively straightforward, various factors can hinder an accurate determination of the distance D. Some of these factors are described by reference to FIGS. 3A and 3B. Each of FIGS. 3A and 3B shows, in a simplified form and on the same time scale, an example of a beat signal waveform and the modulating bias current used to create that beat signal. As seen in FIG. 3A, there is an abrupt phase reversal in the beat signal waveform at the inflection of the modulating wave (i.e., where the triangle wave goes from rising to falling). A similar phase reversal occurs at each inflection of the bias current modulation wave (including each falling-to-rising inflection). These phase reversals can increase measurement errors when determining $f_{avg}$ or $p_{avg}$. One example of potential inaccuracy is seen by comparing sampling windows A and B. Windows A and B are of equal duration, but located on different portions of the beat signal wave. Window A is located on a portion of the beat signal wave which does not include a phase reversal, and contains 5 peaks. Window B is located on a portion of the beat signal wave that does include a phase reversal. Because the phase reversal occurs near a peak of the beat signal waveform, however, the portions of the beat signal waveform on either side of the phase reversal are treated as a single peak. Because the "peak" surrounding the phase reversal is somewhat wider than other peaks, only 4 peaks are counted for window B. Determining $f_{avg}$ based on window A would thus yield a different value than would result if window B were used. In practice, sampling windows would generally be much longer than is shown in FIG. 3A. These longer windows include numerous beat signal phase reversals, with each of those phase reversals representing a potential error in the determination of beat signal frequency $f_{avg}$.

Although it is relatively simple to determine how many phase reversals to expect in a particular sampling window for a given modulation wave, it is difficult to precisely calculate how (or if) each of those phase reversal will affect determination of $f_{avg}$ or $p_{avg}$. In particular, the beat signal waveform will not always be in the same phase (i.e., the same part of its cycle) at each modulation wave inflection. Thus, the instantaneous phase reversals accompanying the modulation inflections will occur at different phases of the beat signal. In turn, this will affect how many beat signal peaks (or troughs) are counted in a given sampling window. One example of this is seen by comparing FIG. 3B with FIG. 3A. In FIG. 3B, the beat signal is closer to its trough at the time of phase reversal. This results in a count of two peaks at the phase reversal in window C instead of one peak, as in window B of FIG. 3A. This unpredictability of beat signal phase at the inflections is caused by several factors. One contributing factor is the nonlinearity of the VCSEL itself. Specifically, the change in VCSEL output light frequency in response to bias current change is not truly linear. Yet another contributing factor is the distance being measured. Because the phase of the backscattered light 11 re-entering VCSEL 5 will vary based on that distance D, the phase of the beat signal wave is also affected by that distance.

It is possible, however, to reduce the impact of beat signal phase reversals. As shown in Equation 3, the average beat frequency $f_{avg}$ is a function of the number of beat signal waveforms ($N_{Tm}$) during a period ($T_m$) of the modulating wave.

$$f_{avg} = \frac{N_{TM}}{T_m} = N_{TM} f_m \qquad \text{Equation 3}$$

Increasing $N_{Tm}$ can increase $f_{avg}$ without increasing $T_m$. The ratio of beat signal peaks per phase reversals will thus increase, and the phase changes will thus have a smaller cumulative effect on the overall determination of $f_{avg}$.

Unfortunately, $N_{Tm}$ increase achieved with a high optical frequency excursion can severely disturb the beat signal envelope. This can make beat frequency detection more difficult. Numerous other factors can also complicate frequency determination. For example, the beat signal frequently has a low signal-to-noise ratio (SNR). This low SNR is caused by, e.g., speckling from the target surface. The strength of the backscattered light received by the VCSEL may also be greatly diminished, particularly for longer distances and/or absorptive target surfaces. The shape of the beat signal waveform also complicates determination of $f_{avg}$. In FIGS. 3A and 3B, the beat signal is shown as a regularly-shaped wave for simplicity. In practice, however, beat signal waveforms are not standard sine or square waves. Instead, beat signal waves often have an irregular shape which can be difficult to detect.

Figure 4:
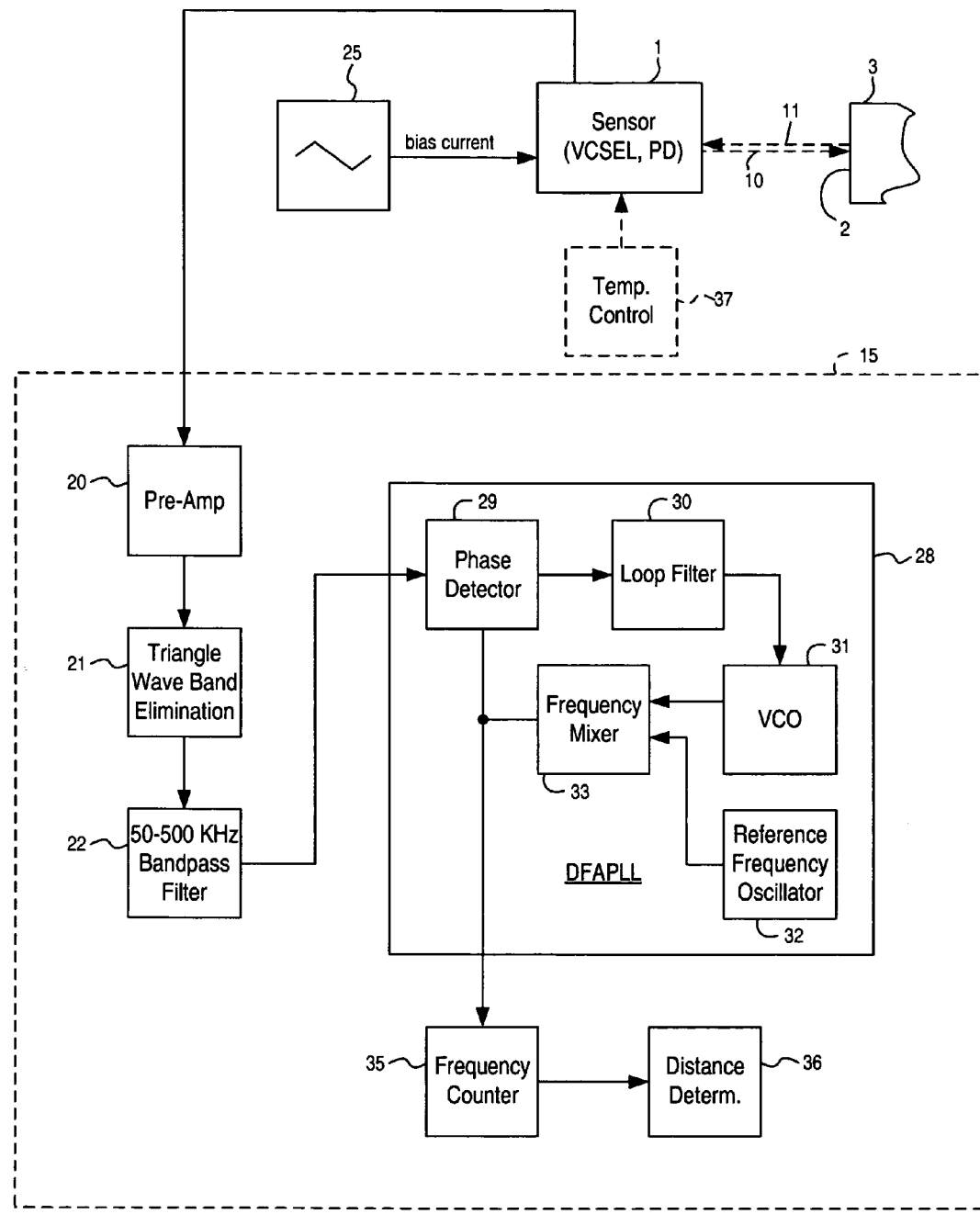
FIG. 4 is a block diagram showing detection circuitry according to at least some exemplary embodiments.

FIG. 4 is a block diagram providing additional details of detection circuitry 15 which, according to at least one exemplary embodiment, addresses the above and other difficulties in determining the beat signal frequency. Many of the individual components of detection circuitry 15 (e.g., filters, amplifiers, etc.) represent previously-known components; such components are represented in block form for simplicity. Persons skilled in the art will appreciate that various known circuits can be employed for each of the components shown in block diagram form. The selection of such circuits will be apparent to persons skilled in the art in view of the information provided herein, which information shows the combination of such known components in a new manner to achieve a new and advantageous result.

VCSEL 5 of sensor 1 is driven by a triangularly-modulated bias current from current generator 25. The beat signal output by PD 6 of sensor 1 is initially fed to pre-amplifier 20. This increases the strength of the relatively low power signal output by PD 6. The output of preamplifier 20 is then fed to triangle wave band eliminator 21. Because VCSEL 5 of sensor 1 is being driven with a triangle-wave modulated bias current, the beat signal will include a harmonic having the triangular wave frequency. Accordingly, triangle wave eliminator 21 subtracts that triangular wave frequency from the beat signal. The output of triangle wave eliminator 21 is then input to band pass filter 22 to remove frequencies outside a predetermined pass range (e.g., 50-500 KHz). This range corresponds to expected values for $f_{avg}$ over a range of values for distance D measurable by sensor 1 and detection circuitry 15. The output from band pass filter 22 is then input to a difference frequency analog phase locked loop (DFA-PLL) 28 for additional noise reduction. It should be appreciated by those skilled in the art that wider distance measurement ranges are possible with this technique and the 50-500 kHz range is only an example. In practical applications, the measurement range is limited only by the ability of the optics to gather sufficient light from the measurement target to cause the self-mixing effect to occur in the laser diode.

Because analog phased locked loops (PLLs) have good noise rejection and amplitude modulation rejection qualities, they can be used to regenerate a less-noisy version of a noisy input signal. In particular, an analog PLL can be used to enhance the accuracy with which beat signal frequency (and thus, distance) is measured. However, typical analog PLLs have a limited "lock" range of approximately ±20% of the center frequency of the voltage controlled oscillator (VCO) in the PLL. In other words, such a PLL would only be able to reproduce input frequencies that are within 20% of the VCO center frequency. If such an analog PLL were used in detection circuitry 15, the system would be limited to measuring displacements within 20% of some reference displacement value. If for example, a conventional analog PLL was selected based on a reference displacement of 1 m, the system would only be able to measure values of D between 0.8 m and 1.2 m.

In the embodiment of FIG. 4, these limitations are avoided through use of a DFAPLL. In particular, a VCO of a DFAPLL has a center frequency which is substantially higher (e.g., an order of magnitude or more) than the highest expected beat signal frequency, but which also has a frequency response which is sufficiently wide. A frequency downconverter is then used to subtract a reference frequency from the VCO output. Because the lock-in range of a DFAPLL can be quite large (e.g., 2 KHZ~1 MHZ), a DFAPLL can be used to expand the range of distances which can be measured.

DFAPLL 28 of detection circuitry 15 includes a phase detector 29, a loop filter 30, a VCO 31, a reference frequency oscillator 32 and a frequency mixer 33. The signal from photosensitive detector 6, after pre-conditioning by pre-amplifier 20, modulation eliminator 21 and band pass filter 22, is input to phase detector 29. Phase detector 29 measures the difference in phase between the beat signal frequency and the output from frequency mixer 33, which is discussed below. A phase difference signal output from phase detector 29 is then filtered by loop filter 30 and fed to VCO 31. Similar to other PLLs, VCO 31 then adjusts its output frequency based on the phase difference signal. Specifically, if the beat signal frequency is lower than the other frequency input to phase detector 29 (i.e., the input received from mixer 33), VCO 31 decreases its output frequency. If the beat signal frequency is higher than the other frequency input to phase detector 29, VCO 31 increases its output frequency.

The output of VCO 31 is fed to mixer 33. Also fed to mixer 33 is a reference frequency generated by reference frequency oscillator 32. In mixer 33, the frequency of the signal output by VCO 31 is reduced (or "downconverted") by the reference frequency from oscillator 32. The downconverted output from mixer 33 (the difference frequency output signal) is then fed to phase detector 29. As previously indicated, phase detector 29 compares the beat signal with the difference frequency output signal from mixer 33 to generate the phase difference signal. Because VCO 31 continually adjusts its output so as to reduce the phase difference signal, and because the VCO output is frequency downconverted in mixer 33 so as to be within the range of the beat signal frequency, the difference frequency output signal from mixer 33 will match the beat signal frequency once DFAPLL 28 reaches equilibrium. However, the difference frequency output signal from mixer 33 is a purified form of the signal received from band pass filter 22. In particular, processing by DFAPLL 28 removes noise and other anomalies in the beat signal previously described.

The following example further illustrates the operation of DFAPLL 28. Suppose that the beat signal frequency will, for the range of velocities to be measured, vary between 50 KHz and 500 KHz. An analog PLL without a frequency down-conversion stage would be unable to reproduce frequencies over that entire range. For example, a VCO with a center frequency of 275 KHz (halfway between 50 KHz and 500 KHz) would only be able to output frequencies between approximately 220 KHz and 330 KHz. If VCO 31 has a 10 MHz center frequency, however, it would be able to output a sufficiently wide range of frequencies. Even if such a VCO has a dynamic range of only 5%, it could output frequencies from approximately 9.5 MHz to approximately 10.5 MHz, a spread of approximately 1000 KHz. Because the output of that VCO would always be higher than the beat signal frequency, however, the VCO output is reduced by a reference frequency (from oscillator 32) of 9.5 MHz. If the beat signal input to phase detector 29 has a frequency of 50 kHz, VCO 31 will (after DFAPLL 28 reaches equilibrium) output a 9.55 MHz signal. After downconversion by the 9.5 MHz reference frequency, a 0.05 MHz (50 KHz) difference frequency output signal is output by mixer 33 and DFAPLL 28. Similarly, a 500 KHz beat signal input to phase detector 29 would cause VCO 31 to ultimately output a 10 MHz signal. After downconversion by the 9.5 MHz reference frequency, a 0.50 MHz (500 KHz) difference frequency output signal is output by mixer 33 and DFAPLL 28.

The difference frequency output signal from DFAPLL 28 is provided to frequency counter 35. Frequency counter 35 then determines the beat signal frequency $f_{avg}$ and outputs a value of $f_{avg}$ to distance calculator 36. Distance calculator 36 (which may be, e.g., a microprocessor or other logic circuitry) then determines the distance D based on Equation 2. In at least some embodiments, detection circuitry 15 (including distance calculator 36) and/or sensor 1 and/or current generator 25 are contained on a signal integrated circuit chip.

In certain embodiments, a temperature controller 37 is also included. Temperature controller 37 may be, e.g., a thermostatically-controlled thermoelectric device in thermal communication with sensor 1. The response of many VCSELs to bias current modulation is also dependent upon temperature, and maintaining the temperature of sensor 1 at a known level can further increase measurement accuracy. It is to be noted, however, that a temperature controller is not required. Notably, and as discussed below, a prototype of the system shown in FIG. 4 has achieved results without temperature control that are satisfactory for many applications.

Figure 5:
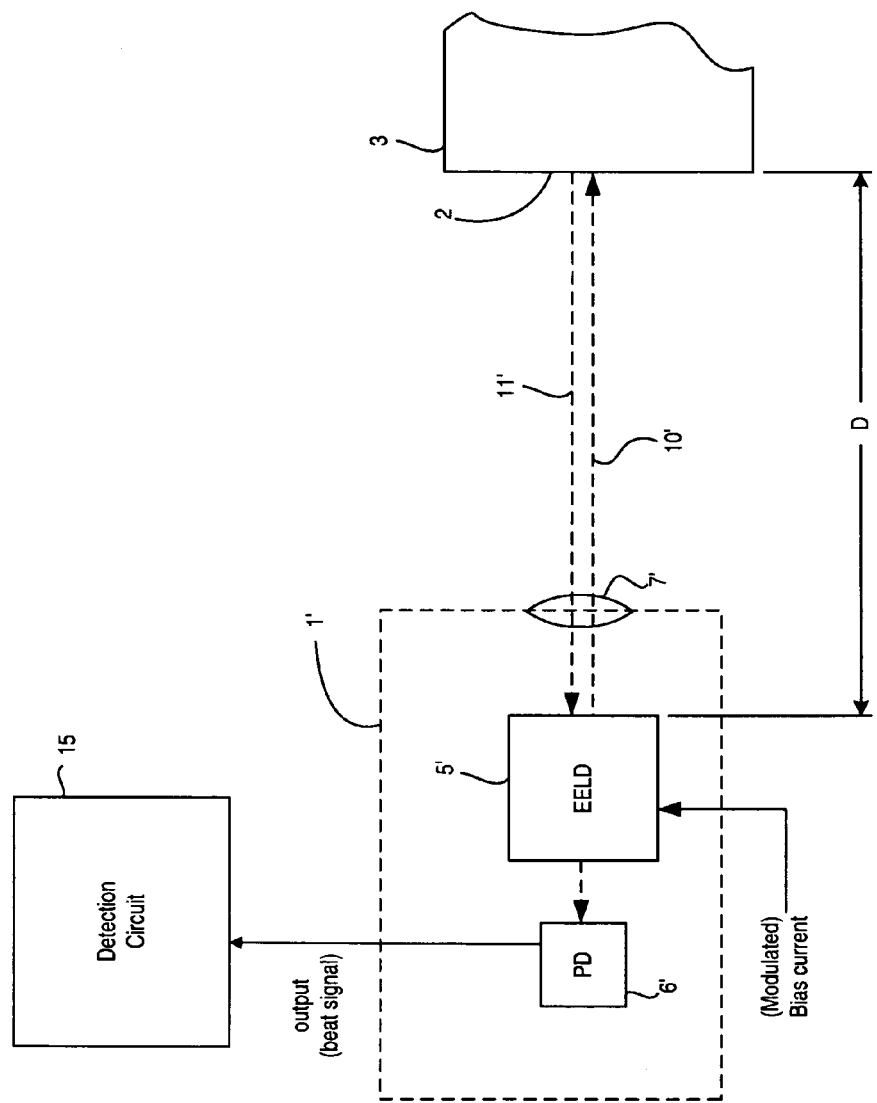
FIG. 5 is a block diagram of a range sensor according to at least one alternate embodiment.

In the embodiments described thus far, a VCSEL was used in sensor 1. Although VCSELs offer numerous advantages over other types of laser devices (e.g., circular beam shape, lower threshold current), other types of laser devices could be used. For example, an edge emitting laser diode (EELD) could alternatively be employed, as shown in FIG. 5. In FIG. 5, sensor 1 of FIG. 1 has been replaced with sensor 1'. Sensor 1' includes an EELD 5'. Unlike a VCSEL, EELD 5' emits from two edges. Accordingly, laser light from one edge of EELD 5' passes through lens 7' and out of sensor 1' as beam 10'. Light emanating from the other edge of EELD 5' strikes PD 6'. The output of PD 6' is then used, in a manner similar to the output from PD 6 of FIG. 1, to measure power output of beam 10'. The signal output from PD 6' is then processed in a manner similar to that previously described for the signal output from PD 6.

A prototype of the system shown in FIG. 4 was constructed using a VCSEL having a nominal wavelength of 850 nm that varied with bias current at a rate ($\Delta\lambda/\Delta I$) of 0.25 nm/mA. The bias current was modulated with a triangular wave having a frequency $f_m$ of 1.3 KHz and a peak-to-peak amplitude of 8 mA +/−0.28 mA, resulting in the values shown in Table 1.

TABLE 1

| | |
|---|---|
| $\Delta\lambda$ | +/−0.07 nm |
| $\Delta f$(laser light) | +/−29 GHz |
| m | 1456 mA/s |
| $\Omega$ | 104 GHz/mA |

In the prototype, the DFAPLL phase detector had a gain $K_d$ of 1.0V/rad, the VCO had a gain $K_O$ of 1.08 $f_O$/V, the VCO center frequency $f_O$ was 10 MHz, and the reference frequency was 9.5 MHz. The input signal to the DFAPLL had an amplitude of 20-300 mV., and the AM rejection was better than 40 dB. The lock-in range of the DFAPLL was 5 KHz to 1 MHz. Distances (to a sandblasted metal target) between 50 mm and 500 mm were measured. When laser temperature was maintained between 0° and 55° C., resolution was 1 mm and ranging accuracy was within 4 mm. When laser temperature was maintained at 25+/−2° C., resolution was 1 mm and ranging accuracy was within 2 mm.

As can be appreciated from the foregoing description, various embodiments provide a self-mixing laser range finder offering improved ranging accuracy and dynamic range, as well as simple configuration and low cost. Such a range sensor can be advantageously utilized in a number of applications. For example, various computer input devices can employ a range sensor instead of electrical contacts, potentiometers and other conventional mechanisms for detecting movement of a keyboard key, a slider or other type of control piece. Examples of input devices employing range measurement are described in commonly-owned U.S. patent application Ser. No. 10/953,107, titled "Keyboard or Other Input Device Using Ranging for Detection of Control Piece Movement" and filed Sep. 30, 2004. As but another example, a distance sensor according to embodiments of the invention could be employed to determine the distance between a user and a computer display. That distance could then be used to adjust the display contents to accommodate users who may be too far from the screen to, e.g., read normal sized text. As yet a further example, a distance sensor according to embodiments of the invention could be used to track a user's hand as part of an input command (e.g., the user moves his hand away from the computer to zoom in a display). Beyond computer input, an accurate and inexpensive distance sensor has numerous other uses (e.g., in a camera autofocus, in numerous computer vision applications, etc.).

Although examples of carrying out the invention have been described, those skilled in the art will appreciate that there are numerous variations and permutations of the above described devices and methods that fall within the spirit and scope of the invention as set forth in the appended claims. It is to be understood that the subject matter defined in the appended claims is not necessarily limited to the specific features or acts described above. Rather, the specific features and acts described above are disclosed as example forms of implementing the claims.

The invention claimed is:

1. A laser range finder, comprising:
   a laser;
   a photosensitive element providing an output signal in response to illumination and positioned to measure self-mixing induced intensity variations in a beam emitted by the laser;
   a phased locked loop (PLL) in electrical communication with the photosensitive element, the PLL receiving the output signal of the photosensitive element;
   a frequency counter receiving output from the PLL;
   at least one signal preconditioning element positioned between the photosensitive element and the PLL, the at least one signal preconditioning element pre-conditioning the photosensitive element output signal prior to receipt of the photosensitive element output signal by the PLL; and
   a bias current generator providing bias current to the laser, and wherein
      the bias current generator provides a bias current modulated with a triangular wave, and
      the at least one signal preconditioning element removes bias current modulation from the photosensitive element output signal prior to the PLL receiving the photosensitive element output signal.

2. The laser range finder of claim 1, wherein the PLL is a difference frequency analog phased lock loop (DFAPLL), the DFAPLL further including:
   a phase detector receiving two input signals, one of the input signals being the output signal of the photosensitive element,
   a voltage controlled oscillator (VCO) receiving an output signal from the phase detector,
   a reference frequency oscillator, and
   a frequency mixer receiving an output signal from the VCO and a reference frequency signal from the reference frequency oscillator, the frequency mixer providing a difference frequency output signal as the other of the two input signals to the phase detector and as the output of the DFAPLL.

3. The laser range finder of claim 1, wherein the laser is a vertical cavity surface emitting laser.

4. The laser range finder of claim 1, further comprising a temperature controller thermally coupled to the laser.

5. The laser range finder of claim 1, wherein the at least one signal preconditioning element includes a band pass filter having a pass range of approximately 50 KHz to approximately 500 KHz.

6. A laser range finder, comprising:
   a laser;
   a photosensitive element providing an output signal in response to illumination and positioned to measure self-mixing induced intensity variations in a beam emitted by the laser;
   a phased locked loop (PLL) in electrical communication with the photosensitive element, the PLL receiving the output signal of the photosensitive element;
   a frequency counter receiving output from the PLL; and
   a modulated bias current generator providing a triangularly modulated bias current to the laser, and wherein the PLL is a difference frequency analog phased lock loop (DFAPLL), the DFAPLL further including
      a phase detector receiving two input signals, one of the input signals being the output signal of the photosensitive element,
      a voltage controlled oscillator (VCO) receiving an output signal from the phase detector,
      a reference frequency oscillator, and
      a frequency mixer receiving an output signal from the VCO and a reference frequency signal from the reference frequency oscillator, the frequency mixer providing a difference frequency output signal as the other of the two input signals to the phase detector and as the output of the DFAPLL.

7. The laser range finder of claim 6, wherein the laser is an edge emitting laser diode.

8. A method for measuring distance, comprising:
   illuminating a target surface with a beam emitted by a laser;
   receiving a backscattered portion of the beam in an emitting cavity of the laser;
   generating an output power signal based on variation in beam power caused by self-mixing;
   processing the power output signal with an analog phase locked loop (APLL), wherein the processing step further comprises
      generating a phase difference signal based on the output power signal and a second signal,
      generating a voltage controlled oscillator (VCO) signal based on the phase difference signal, wherein said generating a VCO signal includes generating a signal having a frequency that is at least one order of magnitude greater than a frequency of the output power signal,
      mixing the VCO signal with a reference signal to generate the second signal, wherein said mixing the VCO signal with a reference signal includes mixing the VCO signal with a signal having a frequency greater than the output power signal frequency and less than the VCO signal frequency, and
      outputting the second signal as the APPL-processed output power signal; and
   determining a frequency of the APPL-processed output power signal.

9. The method of claim 8, further comprising maintaining the temperature of the laser within a predetermined range.

10. The method of claim 8, further comprising applying a triangularly modulated bias current to the laser.

11. The method of claim 10, further comprising removing a bias current modulation from the power output signal.

* * * * *